United States Patent
Kitano et al.

(10) Patent No.: US 9,806,236 B2
(45) Date of Patent: Oct. 31, 2017

(54) LIGHT-EMITTING DEVICE AND METHOD FOR PRODUCING THE SAME

(71) Applicant: Sharp Kabushiki Kaisha, Osaka-shi, Osaka (JP)

(72) Inventors: Masaharu Kitano, Osaka (JP); Kohji Miyake, Osaka (JP); Takashi Ono, Osaka (JP); Toshio Hata, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/022,968

(22) PCT Filed: Oct. 6, 2014

(86) PCT No.: PCT/JP2014/076672
§ 371 (c)(1),
(2) Date: Mar. 18, 2016

(87) PCT Pub. No.: WO2015/056590
PCT Pub. Date: Apr. 23, 2015

(65) Prior Publication Data
US 2016/0233387 A1    Aug. 11, 2016

(30) Foreign Application Priority Data

Oct. 15, 2013    (JP) ................................ 2013-214582
Oct. 15, 2013    (JP) ................................ 2013-214583

(51) Int. Cl.
*H01L 33/48*    (2010.01)
*C09K 11/61*    (2006.01)
(Continued)

(52) U.S. Cl.
CPC .......... *H01L 33/483* (2013.01); *C09K 11/617* (2013.01); *C09K 11/7734* (2013.01);
(Continued)

(58) Field of Classification Search
CPC ..... H01L 33/483; H01L 33/32; H01L 33/501; H01L 33/502; H01L 33/504; H01L 33/56;
(Continued)

(56) References Cited

U.S. PATENT DOCUMENTS 8,084,530 B2 * 12/2011 Tanikawa ................ C08L 83/12
                                                            313/502
8,469,760 B2 *  6/2013 Maruyama ......... C09K 11/0883
                                                            427/64
(Continued)

FOREIGN PATENT DOCUMENTS

| JP | 2007-270004 A |   | 10/2007 |
| JP | 2008-166311 A |   | 7/2008 |
| JP | 2008166311    | * | 7/2008 |
| JP | 2010-141354 A |   | 6/2010 |
| JP | 2010-157608 A |   | 7/2010 |
| JP | 2010-251621 A |   | 11/2010 |
| JP | 2011-014697 A |   | 1/2011 |
| JP | 2011-129791 A |   | 6/2011 |
| JP | 2013-060506 A |   | 4/2013 |
| JP | 2013-084702 A |   | 5/2013 |
| TW | 200946646 A1  |   | 11/2009 |
| TW | 201139616 A1  |   | 11/2011 |
| TW | 201214798 A1  |   | 4/2012 |

(Continued)

OTHER PUBLICATIONS

Official Communication issued in International Patent Application No. PCT/JP2014/076672, dated Dec. 2, 2014.

*Primary Examiner* — Michael Trinh
(74) *Attorney, Agent, or Firm* — Keating & Bennett, LLP

(57) ABSTRACT

A light-emitting device includes a substrate, a light-emitting element disposed on the substrate, and a sealing member for sealing the light-emitting element. The sealing member contains at least a particulate red phosphor. The red phosphor contains at least a $Mn^{4+}$-activated fluoride complex phosphor. The sealing member has an upper surface with irregularities on at least part of the upper surface.

11 Claims, 6 Drawing Sheets

(51) Int. Cl.
*C09K 11/77* (2006.01)
*H01L 33/50* (2010.01)
*H01L 33/56* (2010.01)
*H01L 33/32* (2010.01)
*H01L 33/62* (2010.01)

(52) U.S. Cl.
CPC ............ *H01L 33/32* (2013.01); *H01L 33/501* (2013.01); *H01L 33/504* (2013.01); *H01L 33/56* (2013.01); *H01L 33/502* (2013.01); *H01L 33/62* (2013.01); *H01L 2224/32245* (2013.01); *H01L 2224/45144* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01); *H01L 2933/0041* (2013.01)

(58) Field of Classification Search
CPC .......... H01L 33/62; H01L 2224/48091; H01L 2224/48247; H01L 2224/48257; H01L 2224/73265; H01L 2224/32245; H01L 2924/181; H01L 2924/20752; H01L 2924/20753; H01L 2933/0041
See application file for complete search history.

(56) References Cited

U.S. PATENT DOCUMENTS

| | | | |
|---|---|---|---|
| 2005/0218781 A1* | 10/2005 | Chen | C09K 11/641 313/467 |
| 2010/0091215 A1* | 4/2010 | Fukunaga | C09K 11/664 349/61 |
| 2010/0142189 A1 | 6/2010 | Hong et al. | |
| 2012/0083056 A1 | 4/2012 | Shinbori et al. | |
| 2012/0161621 A1 | 6/2012 | Sato | |
| 2012/0293980 A1* | 11/2012 | Yoshikawa | G02F 1/133603 362/84 |
| 2012/0300155 A1 | 11/2012 | Winkler et al. | |

FOREIGN PATENT DOCUMENTS

| | | |
|---|---|---|
| TW | 201238097 A1 | 9/2012 |
| WO | 2011/096116 A1 | 8/2011 |

* cited by examiner

LIGHT-EMITTING DEVICE AND METHOD FOR PRODUCING THE SAME

TECHNICAL FIELD

The present invention relates to a light-emitting device and to a method for producing the same.

BACKGROUND ART

A light-emitting device that uses a combination of a light-emitting element and a phosphor is attracting attention as a next-generation light-emitting device expected to realize low power consumption, downsizing, high luminance, and a wide color reproducibility range and is being actively researched and developed.

For example, PTL 1 (Japanese Unexamined Patent Application Publication No. 2010-157608) describes a light-emitting element emitting light that excites a blue phosphor and a green phosphor but does not substantially excite a red phosphor.

PTL 2 (Japanese Unexamined Patent Application Publication No. 2011-14697) describes the use of light emitted from a light-emitting element to excite a blue phosphor, a green phosphor, and an orange phosphor.

CITATION LIST

Patent Literature

PTL 1: Japanese Unexamined Patent Application Publication No. 2010-157608 (Japanese Patent No. 5195415)
PTL 2: Japanese Unexamined Patent Application Publication No. 2011-14697

SUMMARY OF INVENTION

Technical Problem

There is a demand for the provision of a light-emitting device having light-emission characteristics suitable for display applications. The present invention has been made in view of the foregoing circumstances, and an object of the present invention is to provide a light-emitting device having light-emission characteristics suitable for display applications and a method for producing the same.

Solution to Problem

The light-emitting device of the present invention includes a substrate, a light-emitting element disposed on the substrate, and a sealing member for sealing the light-emitting element. The sealing member contains at least a particulate red phosphor. The red phosphor contains at least a $Mn^{4+}$-activated fluoride complex phosphor. The sealing member has an upper surface with irregularities on at least part of the upper surface.

Preferably, the level of the upper surface of the sealing member with respect to the light-emitting element decreases from the circumferential edge of the sealing member in plan view toward the center of the sealing member in plan view. Preferably, the red phosphor is distributed uniformly in the sealing member.

Preferably, the sealing member further contains a green phosphor. Preferably, the red phosphor is contained in an amount of two times or more and four times or less the amount of the green phosphor on a mass basis.

Preferably, the sealing member further contains a sealing resin. Preferably, the sealing resin has a viscosity of 2,000 (mPa·s) or more and 7,000 (mPa·s) or less.

Preferably, the substrate has an opening formed into a rectangular shape in plan view. Preferably, the length of the long sides of the opening is 1 mm or more and 5 mm or less, and the length of the short sides of the opening is 0.05 mm or more and 0.8 mm or less. Preferably, the thickness of the side walls of the substrate that surround the sealing member is 0.02 mm or more and 0.06 mm or less.

The method of producing a light-emitting device according to the present invention includes: a step of fixing a light-emitting element to a substrate; and a sealing step of sealing the light-emitting element fixed to the substrate with a sealing compound. The sealing step includes a step of discharging the sealing compound from a nozzle toward the light-emitting element. The sealing compound contains at least a sealing resin and a red phosphor. The sealing resin has a viscosity of 2,000 (mPa·s) or more and 7,000 (mPa·s) or less. The red phosphor contains at least a $Mn^{4+}$-activated fluoride complex phosphor.

Preferably, the sealing resin contains a phenyl silicone resin. Preferably, the phenyl silicone resin has a viscosity of 10,000 (mPa·s) or more.

Preferably, the light-emitting element is fixed to the substrate using a phenyl silicone-based adhesive. Preferably, wiring patterns formed on the substrate are electrically connected to the light-emitting element before the sealing step.

Preferably, the sealing compound is supplied to the light-emitting element through an opening formed in the substrate. Preferably, the nozzle has an inner diameter equal to or less than the length of the short sides of the opening.

Preferably, the substrate is made of a resin. Preferably, the light-emitting elements are disposed on a lead frame. Preferably, after the sealing step, the lead frame is cut at positions between adjacent light-emitting elements.

Advantageous Effects of Invention

According to the present invention, a light-emitting device having light-emission characteristics suitable for display applications can be provided.

DESCRIPTION OF EMBODIMENTS

Figure 1:
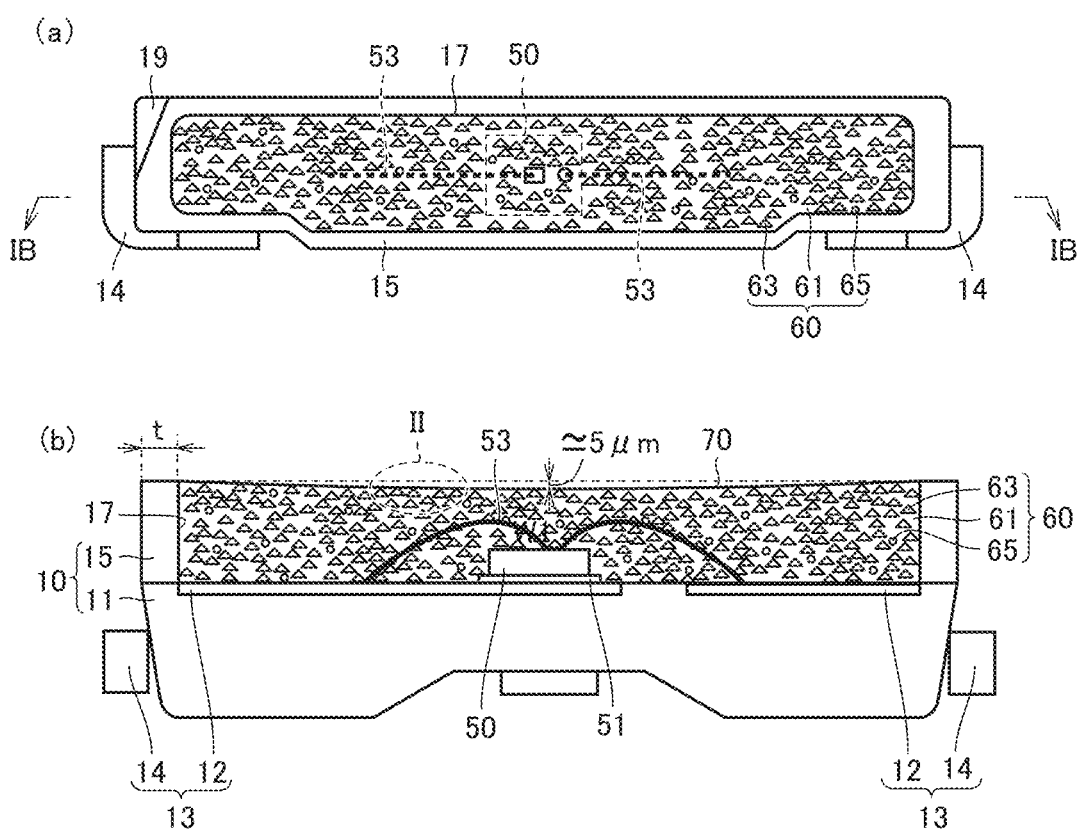
FIG. 1(a) is a plan view of a light-emitting device in one embodiment of the present invention.
FIG. 1(b) is a cross-sectional view taken along line IB-IB shown in FIG. 1(a).

The light-emitting device of the present invention and a method for producing the same will be described with reference to the drawings. In the drawings in the present invention, the same reference numerals designate the same or corresponding parts. Relations between dimensions such as length, width, thickness, and depth in each drawing are appropriately changed for clarification and simplification of the drawing and do not represent actual dimensional relations.

[Configuration of Light-Emitting Device]

Figure 2:
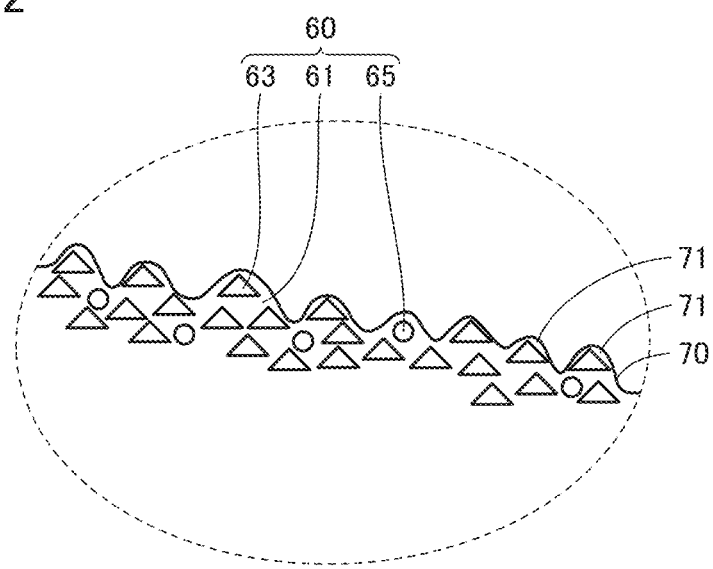
FIG. 2 is an enlarged view of region II shown in FIG. 1(b).
Figure 3:
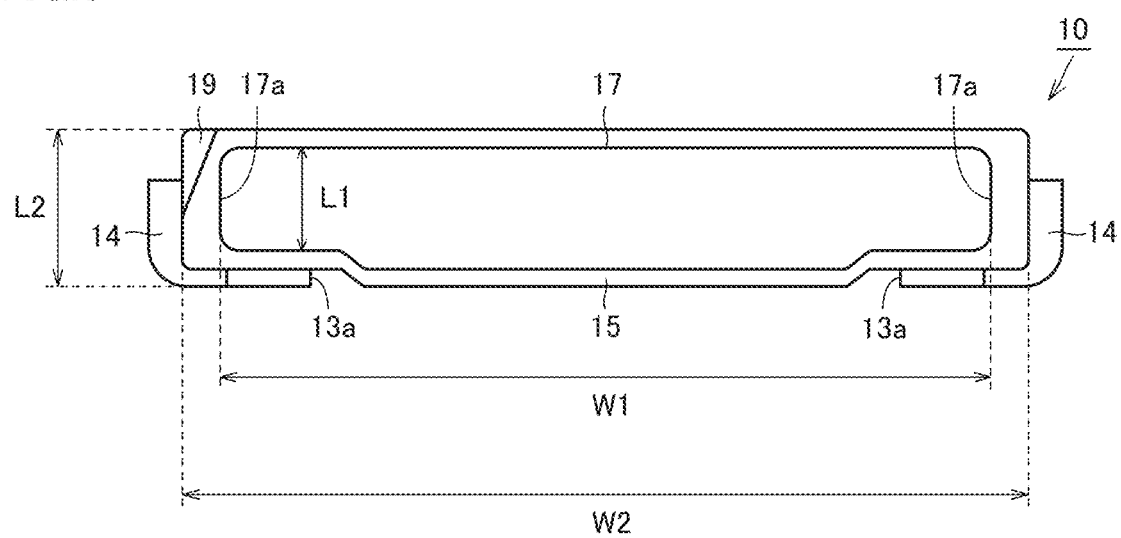
FIG. 3 is a plan view of a substrate shown in FIG. 1.

FIG. 1(a) is a plan view of a light-emitting device in one embodiment of the present invention, and FIG. 1(b) is a cross-sectional view taken along line IB-IB shown in FIG. 1(a). FIG. 2 is an enlarged view of region II shown in FIG. 1(b). FIG. 3 is a plan view of a substrate 10 shown in FIG. 1. The light-emitting device in the present embodiment includes the substrate 10, a light-emitting element 50 disposed on the substrate 10, and a sealing member 60 for sealing the light-emitting element 50.

<Substrate>

A recess 17 is formed on the upper surface of the substrate 10. Hereinafter, a portion of the substrate 10 that corresponds to side walls of the recess 17 is denoted as a "frame portion 15," and a portion of the substrate 10 that is located below the frame portion 15 is denoted as a "stage portion 11."

Preferably, the stage portion 11 is made of a resin and formed into a plate or foil shape. The light-emitting element 50 is disposed on the upper surface of the stage portion 11 (the bottom surface of the recess 17). Therefore, it is preferable that the stage portion 11 has wiring patterns 13 for supply external power to the light-emitting element 50.

No particular limitation is imposed on the configuration of the wiring patterns 13. For example, each of the wiring patterns 13 includes an inner lead section 12 disposed inside the stage portion 11 and an outer lead section 14 disposed outside the stage portion 11, and the inner lead section 12 and the outer lead section 14 are connected to each other within the wiring pattern 13. At least part of the inner lead sections 12 are exposed at the upper surface of the stage portion 11, and the light-emitting element 50 is disposed on one of the exposed portions of the inner lead sections 12 that are exposed at the upper surface of the stage portion 11. The light-emitting device in the present embodiment is connected to a board to which the light-emitting device is mounted (e.g., a mounting board) through the outer lead sections 14. Preferably, the above-described wiring patterns 13 are made of an electrically conductive material and are formed, for example, by plating at least one of silver, platinum, gold, and copper with at least one of silver plating, gold plating, and silver-palladium plating.

When a lead frame is used for the stage portion 11, it is not necessary to separately provide the wiring patterns 13 for the stage portion 11. In this case, a small and lightweight light-emitting device can be provided at low cost.

The frame portion 15 is disposed at the upper circumferential edge of the stage portion 11 so as to surround the light-emitting element 50 disposed on the upper surface of the stage portion 11 and defines the outer shape of the sealing member 60. The frame portion 15 may be formed integrally with the stage portion 11 or may be connected to the stage portion 11 using an adhesive, a fixing member, etc.

The thickness t of the frame portion 15 (the thickness of the side walls of the substrate 10 that surround the sealing member 60) is preferably 0.01 mm or more and 0.07 mm or less. When the thickness t of the frame portion 15 is 0.01 mm or more, high light emission intensity can be maintained. When the thickness t of the frame portion 15 is 0.07 mm or less, the light-emitting device can be reduced in size. More preferably, the thickness t of the frame portion 15 is 0.02 mm or more and 0.06 mm or less.

No particular limitation is imposed on the shape, size, etc. of an opening of the recess 17 (an opening formed in the substrate 10). When the opening of the recess 17 is formed into a rectangular shape in plan view, the length W1 of the long sides of the opening is preferably 1 mm or more and 5 mm or less, and the length L1 of the short sides of the opening is preferably 0.05 mm or more and 0.8 mm or less (FIG. 3). In this case, a sealing compound 160 can be supplied to the recess 17 with no spillover (see FIG. 5). In addition, irregularities 71 tend to be formed on an upper surface 70 of the sealing member 60. Corners of the opening of the recess 17 in plan view may be chamfered or may not be chamfered. As used herein, "in plan view" means that the light-emitting device is viewed from above the light-emitting element 50.

When the frame portion 15 has a rectangular outer shape in plan view, it is preferable that the length W2 of the long sides of the frame portion 15 is at least 3.57 times the length L2 of the short sides of the frame portion 15. In this case, the formation of the irregularities 71 on the upper surface 70 of the sealing member 60 is facilitated. In addition, since the short sides of the frame portion 15 can be shortened, the light-emitting device in the present embodiment is particularly suitable for a side-emission type light-emitting device. In the "side-emission type light-emitting device," a surface of the light-emitting device that is perpendicular to its light emission surface is mounted on a mounting board provided with an electric circuit such as a driving circuit. The use of such a light-emitting device allows the provision of a display device etc. having higher color reproducibility and further reduced in thickness.

Preferably, inner surfaces 17a of the recess 17 are located outside of end surfaces 13a of the wiring patterns 13 with respect to the long side direction of the frame portion 15 (FIG. 3). In this case, the short sides of the frame portion 15 can be shortened, and this allows space-saving. In addition, the coverage of the upper surface of the stage portion 11 with the inner lead sections 12 can be increased, and this allows an improvement in reflectivity. Preferably, the upper surface of the frame portion 15 is flat. In this case, leakage of a highly viscous sealing compound to the outside of the frame portion 15 can be prevented. The "inner surfaces 17a of the recess 17" refer to inner surfaces of the recess 17 that extend in the short side direction of the opening of the recess 17. The "end surfaces 13a of the wiring patterns 13" refer to end surfaces of the wiring patterns 13 that extend in the short end direction of the opening of the recess 17 and located inward with respect to the long side direction of the opening of the recess 17.

Preferably, the above-described frame portion 15 is made of a heat-resistant material. Preferably, the frame portion 15 is made of, for example, a heat-resistant polymer. Preferably, an indication portion 19 that indicates the polarity of one of the wiring patterns 13 (a cathode in the present embodiment) is provided on the upper surface of the frame portion 15 in a position near the one of the wiring patterns 13 (FIGS. 1(a) and 3). This allows external power to be supplied to the light-emitting device through the wiring patterns 13 without wrong polarity.

The thicknesses t of the frame portion 15, W1, L1, W2, and L2 described above can be estimated, for example, by observation of lattice images which are high-magnification images observed under a scanning electron microscope etc.

<Light-Emitting Element>

Preferably, the light-emitting element 50 is fixed to one of the inner lead sections 12 through an adhesive 51 and connected to the inner lead sections 12 through conductive wires 53. Preferably, the adhesive 51 is a phenyl silicone-based adhesive. This allows the provision of a light-emitting device having excellent weather resistance. The phenyl silicone-based adhesive means an adhesive containing a component derived from a phenyl silicone resin. The "component derived from a phenyl silicone resin" means a component formed by removing at least one hydrogen atom from the phenyl silicone resin. The conductive wires 53 are made of preferably a low-resistance material and more preferably a metal.

Preferably, the light-emitting element 50 is a light-emitting element that emits light (primary light) having a peak wavelength in a blue wavelength region of 430 to 470 nm (more preferably 440 to 470 nm). When the light from the light-emitting element 50 has a peak wavelength of 430 nm or longer, a reduction in the contribution of a blue light component in the light from the light-emitting device can be prevented, so that deterioration of color rendering properties can be prevented. When the light from the light-emitting element 50 has a peak wavelength of 470 nm or shorter, a reduction in the brightness of the light from the light-emitting device can be prevented. Therefore, when the light from the light-emitting element 50 has a peak wavelength of 430 nm or longer and 470 nm or shorter, a practically usable light-emitting device can be obtained. Preferably, the light-emitting element 50 is, for example, a light-emitting element formed from gallium nitride (GaN)-based semiconductors and is formed into a rectangular shape in plan view.

<Sealing Member>

Preferably, the sealing member 60 is provided so as to fill the recess 17. In this case, the light-emitting element 50 is sealed by the sealing member 60.

The irregularities 71 are formed on at least part of the upper surface 70 of the sealing member 60. As shown in Examples described later, the present inventors have verified that, although no irregularities are formed on the upper surface of a sealing member when a red phosphor such as CaAlSiN$_3$:Eu or (Sr.Ca)AlSiN$_3$:Eu is used, irregularities are formed on the upper surface of a sealing member when a Mn$^{4+}$-activated fluoride complex phosphor is used. The Mn$^{4+}$-activated fluoride complex phosphor has light-emission characteristics suitable for display applications (as described later), so that whether or not the light-emitting device is suitable as a light-emitting device for display applications can be determined by checking the flatness of the upper surface 70 of the sealing member 60. Therefore, whether or not the light-emitting device is suitable as a light-emitting device for display applications can be determined without composition analysis of a red phosphor 63 contained in the sealing member 60. The "upper surface 70 of the sealing member 60" means a surface of the sealing member 60 that is exposed from the substrate 10 (a surface of the sealing member 60 that is exposed in the opening of the recess 17).

The present inventors have verified that, as the size of the opening of the recess 17 decreases, the formation of the irregularities 71 on the upper surface 70 of the sealing member 60 is facilitated. This effect is significant when the length L1 of the long sides of the opening of the recess 17 is 1 mm or more and 5 mm or less and the length W1 of the short sides of the opening of the recess 17 is 0.05 mm or more and 0.8 mm or less.

Preferably, the level of the upper surface 70 of the sealing member 60 with respect to the light-emitting element 50 decreases from the circumferential edge of the sealing member 60 in plan view toward the center of the sealing member 60 in plan view. This allows the upper surface 70 of the sealing member 60 to have a lens effect, so that the light from the light-emitting element 50 can be focused. More preferably, the upper surface 70 of the sealing member 60 at the center in plan view is recessed toward the light-emitting element 50 by about 5 μm from the circumferential edge of the upper surface 70 of the sealing member 60 in plan view. As the size of the opening of the recess 17 decreases, the recessed depth of the upper surface 70 of the sealing member 60 decreases, and the recessed area of the upper surface 70 of the sealing member 60 that is recessed toward the light-emitting element 50 decreases. Whether or not the level of the upper surface 70 of the sealing member 60 with respect to the light-emitting element 50 decreases from the circumferential edge in plan view toward the center in plan view can be estimated by observation of lattice images which are high-magnification images observed under a scanning electron microscope etc.

The sealing member 60 described above contains the red phosphor 63, preferably further contains a sealing resin 61, and more preferably further contains a green phosphor 65.

(Red Phosphor)

The red phosphor 63 emits red light upon excitation by the light from the light-emitting element 50 and contains at least a Mn$^{4+}$-activated fluoride complex phosphor. The center wavelength of the emission peak of the Mn$^{4+}$-activated fluoride complex phosphor is 625 nm to 645 nm (e.g., 635 nm), and the half width of the emission peak is about 10 nm. Since the Mn$^{4+}$-activated fluoride complex phosphor exhibits light-emission characteristics suitable for display applications, the light-emitting device in the present embodiment can be preferably used as a light-emitting device for display applications.

However, the Mn$^{4+}$-activated fluoride complex phosphor is inferior in light emission efficiency to conventional red phosphors (e.g., CaAlSiN$_3$:Eu and (Sr.Ca)AlSiN$_3$:Eu). Therefore, it is preferable that the content of the Mn$^{4+}$-activated fluoride complex phosphor is larger than the content of a conventional red phosphor when it is used instead. This can prevent a reduction in chromaticity of the red color or a reduction in light emission intensity of the red light that are caused by the use of the Mn$^{4+}$-activated fluoride complex phosphor. In this case, the Mn$^{4+}$-activated fluoride complex phosphor is unevenly distributed on the upper surface 70 of the sealing member 60. Since the Mn$^{4+}$-activated fluoride complex phosphor is formed into particles, the irregularities 71 are formed on at least part of the upper surface 70 of the sealing member 60.

The phrase "the Mn$^{4+}$-activated fluoride complex phosphor is formed into particles" means that the volume-based median diameter of the Mn$^{4+}$-activated fluoride complex phosphor is 10 μm or more and 90 μm or less. Preferably, the volume-based median diameter of the Mn$^{4+}$-activated fluoride complex phosphor is 20 μm or more and 50 μm or less. The "volume-based median diameter of the red phosphor 63" means the median diameter of the particle size distribution of the red phosphor measured on a volume basis and is measured using, for example, a flow particle image analyzer.

The Mn$^{4+}$-activated fluoride complex phosphor is, for example, K$_2$SiF$_6$:Mn. In K$_2$SiF$_6$:Mn, K may be partially or fully substituted by at least one of Li, Na, and NH$_4$.

Preferably, the activating element in the $Mn^{4+}$-activated fluoride complex phosphor is 100% Mn (manganese). However, the $Mn^{4+}$-activated fluoride complex phosphor may further contain, as an activating element, at least one of Ti, Zr, Ge, Sn, Al, Ga, B, In, Cr, Fe, Co, Ni, Cu, Nb, Mo, Ru, Ag, Zn, and Mg in an amount of less than 10% by mole based on the total amount of the activating elements. Preferably, in the host crystal (e.g., $K_2SiF_6$), the activating elements occupy 0.5% to 10% of sites that are expected to be occupied by Si (Si sites). In the host crystal, 10% or less of the Si sites may be substituted by an element other than the activating elements. A metal element (e.g., Mn) that occupies interstitial sites may be added to the host crystal.

The red phosphor 63 may further include a red phosphor (e.g., $CaAlSiN_3$:Eu or $(Sr.Ca)AlSiN_3$:Eu) different from the $Mn^{4+}$-activated fluoride complex phosphor, so long as the effects of the present embodiment are not impaired. The $Mn^{4+}$-activated fluoride complex phosphor is expensive. Therefore, the use of the red phosphor 63 further including a red phosphor different from the $Mn^{4+}$-activated fluoride complex phosphor is suitable for a low-cost light-emitting device having high color reproducibility.

(Sealing Resin)

Preferably, the sealing resin 61 has a viscosity of 2,000 (mPa·s) or more and 7,000 (mPa·s) or less. In this case, the light-emitting device can be mass-produced. In addition, the formation of the irregularities 71 on the upper surface 70 of the sealing member 60 is facilitated.

Preferably, the sealing resin 61 contains at least a phenyl silicone resin. In this case, the viscosity of the sealing resin 61 becomes 2,000 (mPa·s) or more and 7,000 (mPa·s) or less. The sealing resin 61 more preferably contains a phenyl silicone resin having a viscosity of 5,000 (mPa·s) or more and still more preferably contains a phenyl silicone resin having a viscosity of 10,000 (mPa·s) or more. When the viscosity of the phenyl silicone resin is 5,000 (mPa·s) or more, the viscosity of the sealing resin 61 tends to be 2,000 (mPa·s) or more and 7,000 (mPa·s) or less. It is difficult to get a phenyl silicone resin having a viscosity of more than 40,000 (mPa·s). Therefore, the viscosity of the phenyl silicone resin is preferably 40,000 (mPa·s) or less.

The sealing resin 61 may further contain a phenyl silicone resin having a viscosity of less than 5,000 (mPa·s) and may further contain a resin different from the phenyl silicone resins (e.g., an organic-modified silicone resin), so long as the viscosity of the sealing resin 61 is 2,000 (mPa·s) or more and 7,000 (mPa·s) or less. The "viscosity of the sealing resin 61" and the "viscosity of a phenyl silicone resin" refer to values measured according to JIS Z 8803:2011 (Method for measuring viscosity of liquid).

(Green Phosphor)

The green phosphor 65 emits green light upon excitation by the light from the light-emitting element 50. Preferably, the green phosphor 65 is, for example, $(Ba, Sr, Ca, Mg)_2SiO_4$:Eu, $(Mg, Ca, Sr, Ba)Si_2O_2N_2$:Eu, $(Ba, Sr)_3Si_6O_{12}N_2$:Eu, Eu-activated $\beta$-SiAlON, $(Sr, Ca, Ba)(Al, Ga, In)_2S_4$:Eu, $(Y, Tb)_3(Al, Ga)_5O_{12}$:Ce, $Ca_3(Sc, Mg, Na, Li)_2Si_3O_{12}$:Ce, $(Ca, Sr)Sc_2O_4$:Ce, etc. These are merely examples of the green phosphor 65, and the green phosphor 65 is not limited thereto.

(Amounts Added)

Preferably, the red phosphor 63 is contained in an amount of two times or more and five times or less the amount of the green phosphor 65 on a mass basis. When the red phosphor 63 is contained in an amount of two times or more the amount of the green phosphor 65 on a mass basis, the formation of the irregularities 71 on the upper surface 70 of the sealing member 60 is facilitated. In addition, a reduction in chromaticity of the red color or a reduction in light emission intensity of the red light that are caused by the use of the $Mn^{4+}$-activated fluoride complex phosphor having low light emission efficiency can be prevented. When the red phosphor 63 is contained in an amount of five times or less the amount of the green phosphor 65 on a mass basis, an excessive increase in the contribution of the red light component in the light from the light-emitting device can be prevented. More preferably, the red phosphor 63 is contained in an amount of two times or more and four times or less the amount of the green phosphor 65 on a mass basis.

The sealing member 60 may further contain at least one of $SiO_2$, $TiO_2$, $ZrO_2$, $Al_2O_3$, and $Y_2O_3$, so long as the effects of the present embodiment are not impaired.

<Operation>

When external power is supplied to the light-emitting element 50 through the wiring patterns 13, the light-emitting element 50 generates blue light. Part of the blue light is absorbed by the red phosphor 63, converted to red light by wavelength conversion, and then emitted to the outside of the sealing member 60. Part of the rest of the blue light is absorbed by the green phosphor 65, converted to green light by wavelength conversion, and then emitted to the outside of the sealing member 60. The rest of the blue light is emitted to the outside of the sealing member 60 without being absorbed by the red phosphor 63 and by the green phosphor 65. Since the red light, the green light, and the blue light are simultaneously emitted to the outside of the sealing member 60 as described above, white light is emitted from the light-emitting device in the present embodiment.

[Method for Producing Light-Emitting Devices]

Figure 4:
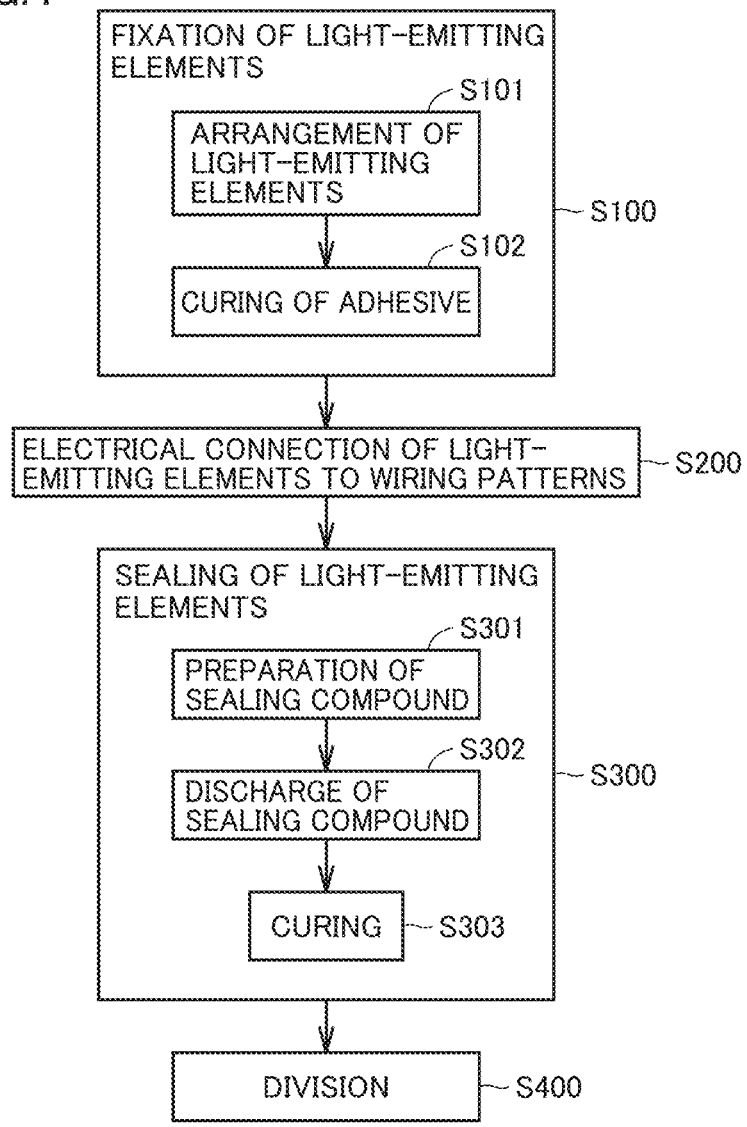
FIG. 4 is a flowchart showing a method of producing the light-emitting device in the embodiment of the present invention.

FIG. 4 is a flowchart showing an example of a method for producing light-emitting devices in the present embodiment. The method for producing light-emitting devices in the present embodiment includes a step of fixing light-emitting elements 50 to a substrate 10 (step S100) and a sealing step of sealing the light-emitting elements 50 fixed to the substrate 10 with a sealing compound 160 (step S300). Preferably, before the sealing step, wiring patterns 13 formed on the substrate 10 are electrically connected to the light-emitting elements 50 (step S200). Preferably, after the sealing step, a division step (step S400) is performed. In the following description, the division processing is performed after the light-emitting elements are sealed to thereby produce the light-emitting devices, and the same components are denoted by the same numerals even before and after the division processing.

<Fixation of Light-Emitting Elements>

(Arrangement of Light-Emitting Elements)

First, in step S101, the light-emitting elements 50 are arranged on the substrate 10 with spacings therebetween. For example, the light-emitting elements 50 are disposed on inner lead sections 12 with the adhesive 51 interposed between the light-emitting elements 50.

(Curing of Adhesive)

Next, in step S102, the adhesive 51 is cured. Preferably, the substrate 10 with the light-emitting elements 50 arranged thereon is held at a prescribed temperature for a prescribed time. The light-emitting elements 50 are thereby fixed to the inner lead sections 12.

<Electrical Connection of Light-Emitting Elements to Wiring Patterns>

In step S200, each of the light-emitting elements 50 is electrically connected to corresponding inner lead sections 12 using conductive wires 53.

<Sealing of Light-Emitting Elements>
(Preparation of Sealing Compound)

First, in step S301, the sealing compound 160 is prepared. The sealing compound 160 prepared contains the red phosphor 63, preferably further contains the sealing resin 61, and more preferably further contains the green phosphor 65.

(Discharge of Sealing Compound)

Figure 5:
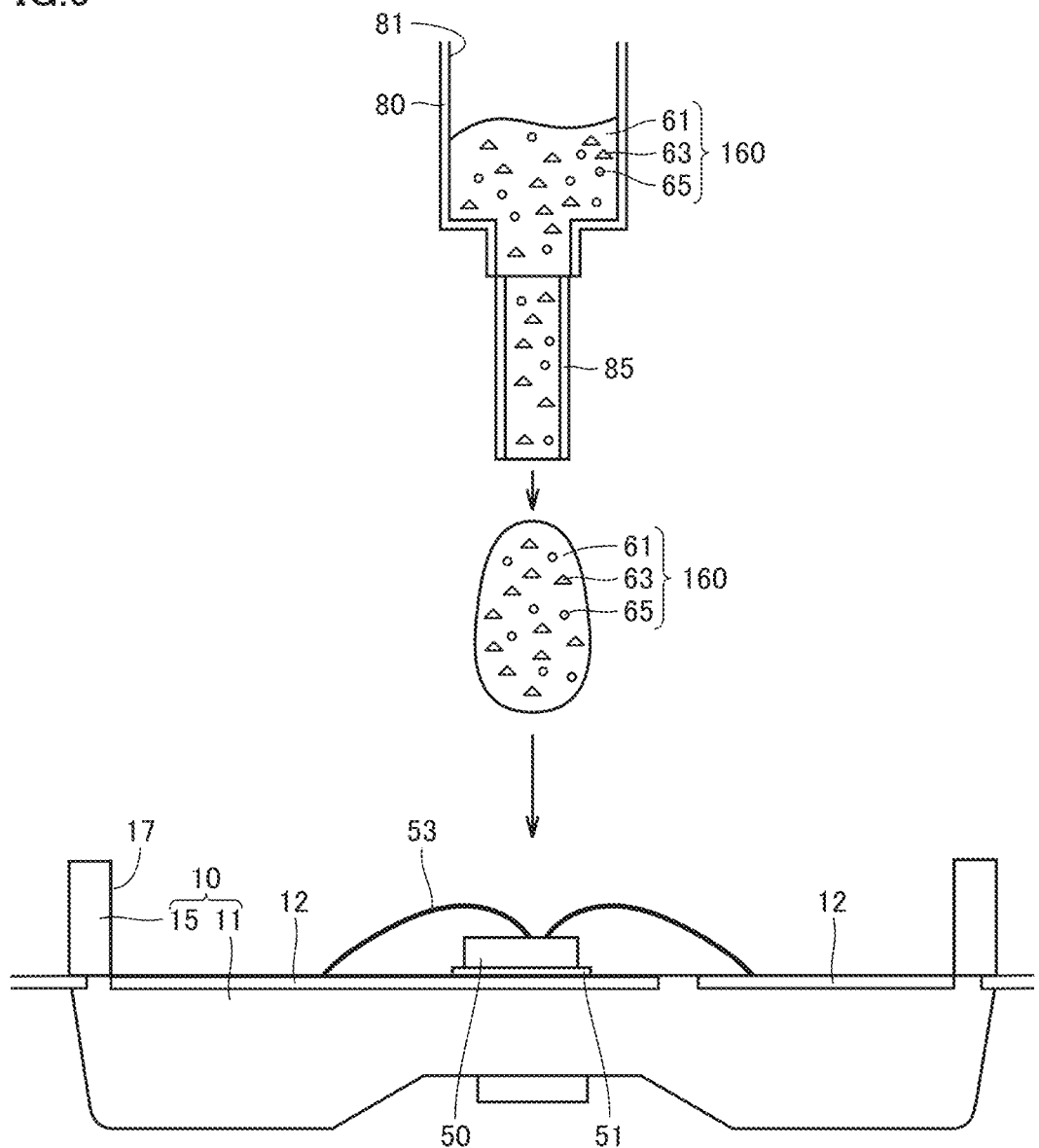
FIG. 5 is a side view schematically illustrating a step of discharging a sealing compound toward a light-emitting element.

Next, in step S302, a discharge apparatus 80 is used to discharge the sealing compound 160 toward each of the light-emitting elements 50. FIG. 5 is a side view schematically illustrating this step. This step can be performed according to the following procedure. The discharge apparatus 80 is disposed above the opening of one of the recesses 17, and the sealing compound 160 is placed in a liquid chamber 81 of the discharge apparatus 80. Then the sealing compound 160 in the liquid chamber 81 is pushed by a piston (not shown). The sealing compound 160 is thereby discharged from a nozzle 85, supplied to the light-emitting element 50 through the opening of the recess 17, and covers the light-emitting element 50.

The content of the red phosphor 63 is larger than the content of a conventional red phosphor when it is used instead, and the volume-based median diameter of the $Mn^{4+}$-activated fluoride complex phosphor is 10 μm or more and 90 μm or less. Therefore, when the red phosphor 63 is used, the front end and inside of the nozzle 85 are more likely to be clogged with the red phosphor 63 than with the conventional red phosphor when it is used instead.

However, when the viscosity of the sealing resin 61 is 2,000 (mPa·s) or more, the red phosphor 63 and the green phosphor 65 can be discharged toward the light-emitting elements 50 without causing clogging of the front end and inside of the nozzle 85. When the red phosphor 63 is used, it is very effective to control the viscosity of the sealing resin 61 to 2,000 (mPa·s) or more. When the viscosity of the sealing resin 61 is 7,000 (mPa·s) or less, the time required for discharge can be prevented from increasing excessively.

Any apparatus used for discharging a resin may be used as the discharge apparatus 80 used, and the configuration of the apparatus is not limited to the configuration shown in FIG. 5.

No particular limitation is imposed on the shape, size, etc. of the nozzle 85. However, preferably, the inner diameter of the nozzle 85 is equal to or less than the length of the short sides of the opening of each recess 17. In this case, the sealing compound 160 can be supplied to each recess 17 with no spillover. More preferably, the outer diameter of the nozzle 85 is equal to or less than the length of the short sides of the opening of each recess 17. Preferably, the inner diameter of the nozzle 85 is 0.2 mm or more, and the outer diameter of the nozzle 85 is 0.4 mm or less.

(Curing)

Next, in step S303, the resin (e.g., the sealing resin 61) contained in the sealing compound 160 is cured. Preferably, the substrate 10 with the light-emitting elements 50 covered with the sealing compound 160 is held at a prescribed temperature for a prescribed time. Sealing members 60 are thereby formed.

In the present embodiment, the red phosphor 63 and the green phosphor 65 are supplied to each light-emitting element 50 without causing clogging of the front end and inside of the nozzle 85. This allows the red phosphor 63 and the green phosphor 65 to be uniformly dispersed in the sealing member 60.

With the sealing compound 160 bulging above the upper surface of the frame portion 15, the resin contained in the sealing compound 160 is cured. In this case, the level of the upper surface 70 of the sealing member 60 with respect to the light-emitting element 50 decreases from the circumferential edge of the sealing member 60 in plan view toward the center of the sealing member 60 in plan view.

<Division>

The substrate 10 is cut at positions between adjacent light-emitting elements 50. When a lead frame is used as the substrate 10, the lead frame is cut at positions between adjacent light-emitting elements 50. The light-emitting device shown in FIG. 1 is thereby obtained.

As described above, the light-emitting device shown in FIG. 1 includes the substrate 10, the light-emitting element 50 disposed on the substrate 10, and the sealing member 60 for sealing the light-emitting element 50. The sealing member 60 contains at least the particulate red phosphor 63. The red phosphor 63 contains at least the $Mn^{4+}$-activated fluoride complex phosphor. The sealing member 60 has the upper surface 70 with the irregularities 71 on at least part of the upper surface 70. This allows a light-emitting device having light-emission characteristics suitable for display applications to be obtained.

Preferably, the level of the upper surface 70 of the sealing member 60 with respect to the light-emitting element 50 decreases from the circumferential edge of the sealing member 60 in plan view toward the center of the sealing member 60 in plan view. This allows the upper surface 70 of the sealing member 60 to have a lens effect. Preferably, the red phosphor 63 is uniformly dispersed in the sealing member 60.

Preferably, the sealing member 60 further contains the green phosphor 65. This allows the provision of a light-emitting device that emits white light.

Preferably, the red phosphor 63 is contained in an amount of two times or more and four times or less the amount of the green phosphor 65 on a mass basis. This can facilitate the formation of the irregularities 71 on the upper surface 70 of the sealing member 60.

Preferably, the sealing member 60 further contains the sealing resin 61. Preferably, the viscosity of the sealing resin is 2,000 (mPa·s) or more and 7,000 (mPa·s) or less. This allows the light-emitting device to be mass-produced.

The method for producing the light-emitting device shown in FIG. 1 includes the step of fixing the light-emitting element 50 to the substrate 10 and a sealing step of sealing the light-emitting element 50 fixed to the substrate 10 with the sealing compound 160. The sealing step includes the step of discharging the sealing compound 160 from the nozzle 85 toward the light-emitting element 50. The sealing compound 160 contains at least the sealing resin 61 and the red phosphor 63. The sealing resin 61 has a viscosity of 2,000 (mPa·s) or more and 7,000 (mPa·s) or less. The red phosphor 63 contains at least the $Mn^{4+}$-activated fluoride complex phosphor. This allows the provision of a light-emitting device having light-emission characteristics suitable for display applications.

Preferably, the sealing resin 61 contains a phenyl silicone resin. Preferably, the phenyl silicone resin has a viscosity of 10,000 (mPa·s) or more. In this case, the viscosity of the sealing resin 61 is 2,000 (mPa·s) or more and 7,000 (mPa·s) or less.

EXAMPLES

The present invention will next be described in detail by way of Examples. However, the present invention is not limited to these Examples.

Examples 1 and 2 and Comparative Examples 1 and 2

Sealing compounds were prepared using different base agents and phosphors with different particle diameters, and the degree of clogging with each of the phosphors was examined using a single discharge apparatus. The results are shown in Table 1.

TABLE 1

| | BASE AGENT OF SEALING COMPOUND | | | PARTICLE | |
|---|---|---|---|---|---|
| | MATERIAL | SILICA | VISCOSITY (mPa · s) | DIAMETER OF PHOSPHOR | OCCURRENCE OF CLOGGING |
| EXAMPLE 1 | PHENYL SILICONE RESIN | NO | 13,000 | MEDIUM | NO |
| COMPARATIVE EXAMPLE 1 | ORGANIC-MODIFIED SILICONE RESIN | YES | LESS THAN 10,000 | MEDIUM | YES |
| EXAMPLE 2 | PHENYL SILICONE RESIN | NO | 13,000 | LARGE | NO |
| COMPARATIVE EXAMPLE 2 | ORGANIC-MODIFIED SILICONE RESIN | YES | LESS THAN 10,000 | LARGE | YES |

As shown in Table 1, in Comparative Examples 1 and 2, at least one of the front end of the nozzle and the inside of the nozzle was clogged with the phosphor. The reason for this may be that the viscosity of the sealing resin contained in the sealing compounds in Comparative Examples 1 and 2 was less than 300 (mPa·s).

In Example 1, the front end of the nozzle and the inside of the nozzle were not clogged with the phosphor. Also in Example 2 in which the particle diameter of the phosphor was large, the front end of the nozzle and the inside of the nozzle were not clogged with the phosphor. The reason for this may be that the viscosity of the sealing resin contained in the sealing compounds in Examples 1 and 2 was 2,000 (mPa·s) or more and 7,000 (mPa·s) or less.

Example 3

First, a substrate was prepared. The substrate had stage portions and frame portions made of a heat resistant polymer. Each stage portion was provided with wiring patterns, and the wiring patterns were plated with a copper alloy or silver. Each frame portion was disposed at the circumferential edge of the upper surface of the stage portion. A recess was formed in the frame portion, and the side surfaces of the recess were inclined outward as the distance from the upper surface of the stage portion increased. The depth of the recess was 0.27 mm. The recess had an opening formed into a rectangular shape in plan view (short sides: 0.5 mm (the length of the longest part of the short sides)×long sides: 3.2 mm), and the corners of the opening in plan view were chamfered.

Next, light-emitting elements emitting light having a peak wavelength at 450 nm were prepared. The light-emitting elements were disposed on respective inner lead sections using a phenyl silicone-based adhesive. Then the substrate was held at 150° C. for 1 hour to cure the phenyl silicone-based adhesive. The light-emitting elements were thereby fixed to the respective inner lead sections.

Next, the light-emitting elements were electrically connected to their respective inner lead sections using gold wires. Then a sealing compound was prepared.

The sealing compound prepared contained a phenyl silicone resin (agent A (base agent)) having a viscosity of 13,000 mPa·s, a phenyl silicone resin (agent B (curing agent)) having a viscosity of 3,600 mPa·s, $K_2SiF_6$:Mn (volume-based median diameter (d50): 34.0 μm, red phosphor), and a green phosphor having a composition of $Eu_{0.05}Si_{11.50}Al_{0.50}O_{0.05}N_{15.95}$ (β-type SiAlON) (volume-based median diameter (d50): 12.0 μm). The above red phosphor was contained in an amount of 76% by mass based on the mass of the phenyl silicone resins, and the above green phosphor was contained in an amount of 24% by mass based on the mass of the phenyl silicone resins.

Next, the sealing compound was discharged toward each of the light-emitting elements using a discharge apparatus. The nozzle of the discharge apparatus used has an outer shape of 0.4 mm and an inner diameter of 0.28 mm. Then the substrate was held at 100° C. for 1 hour and then held at 150° C. for 1 hour. The phenyl silicone resin (agent A (base agent)) was thereby cured with the phenyl silicone resin (agent B (curing agent)). Then the substrate was divided. Side-emission type light-emitting devices (length 0.6 mm×width 3.8 mm×height 1.0 mm) were thereby obtained.

Comparative Example 3

Light-emitting devices were obtained according to the same procedure as described in Example 3 except that $CaAlSiN_3$:Eu (volume-based median diameter (d50): 12 μm) was used as the red phosphor and the content of the red phosphor was 1/10 of the content of the green phosphor.
<Evaluation>

Figure 6:
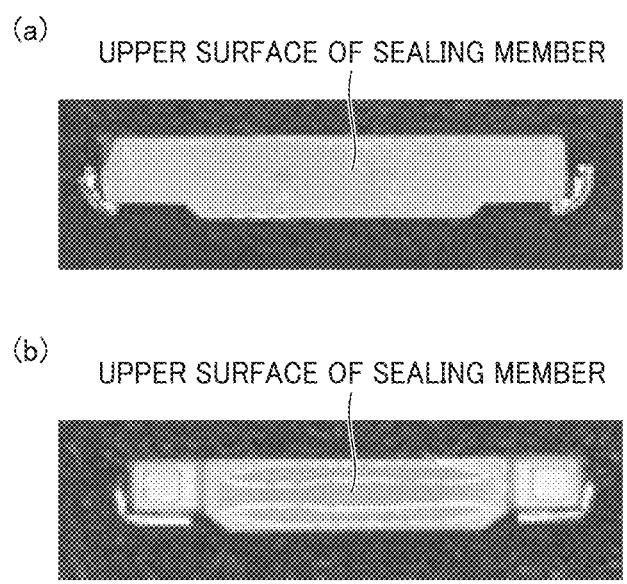
FIG. 6(a) is an image of a light-emitting device in Example 3 when its upper surface is observed.
FIG. 6(b) is an image of a light-emitting device in Comparative Example 3 when its upper surface is observed.

The upper surface of the light-emitting device in Example 3 was observed using a scanning electron microscope. The results are shown in FIG. 6(a). Similarly, the upper surface of the light-emitting device in Comparative Example 3 was observed. The results are shown in FIG. 6(b). In Example 3, irregularities were formed on the upper surface of the sealing member. However, in Comparative Example 3, no irregularities were formed on the upper surface of the sealing member. The content of the $Mn^{4+}$-activated fluoride complex phosphor in Example 3 was set to about 10 times the content of the conventional $CaAlSiN_3$:Eu in Comparative Example 3, in order to substantially match the chromaticity and light emission intensity in Example 3 with the chromaticity and light emission intensity in Comparative Example 3. This may be the reason that above results were obtained.

Figure 7:
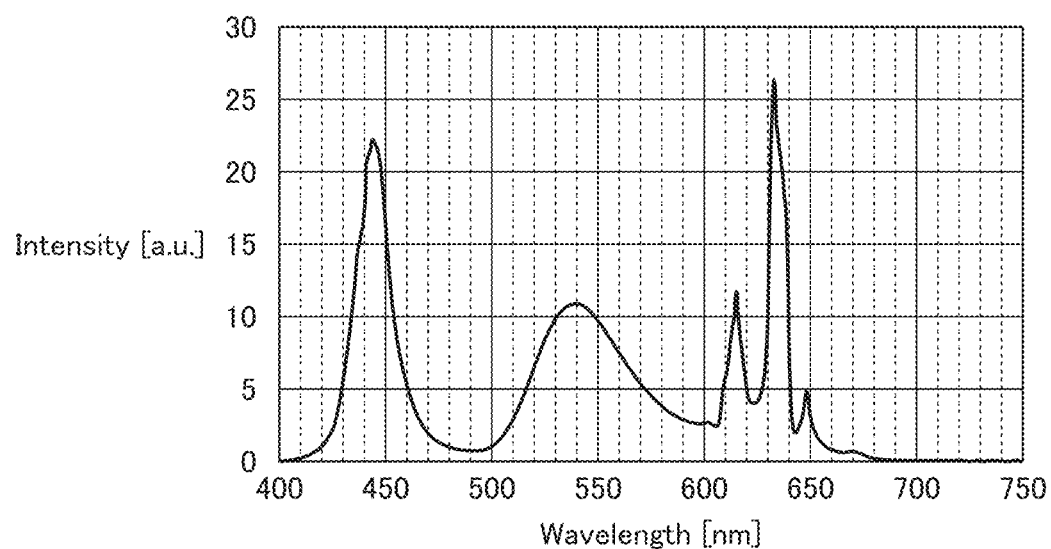
FIG. 7 is a graph showing a light emission spectrum of the light-emitting device in Example 3.

FIG. 7 is a graph showing the light emission spectrum of the light-emitting device obtained in Example 3. In FIG. 7, the vertical axis represents light emission intensity (arbitrary unit), and the horizontal axis represents wavelength (nm). As shown in FIG. 7, the light-emitting device obtained in Example 3 emits blue light (having a peak wavelength of about 445 nm), green light (having a peak wavelength of about 540 nm), and red light (showing a maximum intensity at about 630 nm). Therefore, it can be said that the light-emitting device obtained in Example 3 is capable of emitting light with high color reproducibility at high efficiency.

It should be construed that the embodiments and Examples disclosed herein are illustrative and non-restrictive in every respect. The scope of the present invention is defined not by the preceding description but instead by the scope of the claims and is intended to include any modifications within the scope and meaning equivalent to the scope of the claims.

REFERENCE SIGNS LIST 10 substrate, 11 stage portion, 13 wiring pattern, 13a end surface, 15 frame portion, 17 recess, 17a inner surface, 19 indication portion, 50 light-emitting element, adhesive, 53 conductive wire, 60 sealing member, 61 sealing resin, 63 red phosphor, 65 green phosphor, 70 upper surface, 71 irregularities

The invention claimed is:

1. A light-emitting device comprising:
a substrate;
a light-emitting element on the substrate; and
a sealing member that seals the light-emitting element; wherein
the sealing member includes at least a particulate red phosphor and a particulate green phosphor,
the red phosphor includes at least a $MN_{4+}$-activated fluoride complex phosphor,
the $Mn^{4+}$-activated fluoride complex phosphor includes particles, and
the sealing member includes an upper surface that is recessed toward the light-emitting element from a circumferential edge of the sealing member in a plan view toward a center of the sealing member in the plan view, and includes convex portions that are defined by including the particles of the $Mn^{4+}$-activated fluoride complex phosphor in the sealing member on at least a portion of the recessed upper surface of the sealing member.

2. The light-emitting device according to claim 1, wherein a height of the upper surface of the sealing member with respect to the light-emitting element decreases from a circumferential edge of the sealing member in the plan view toward a center of the sealing member, and the red phosphor is distributed uniformly in the sealing member.

3. The light-emitting device according to claim 1, wherein the red phosphor is included in an amount of two times or more and four times or less than an amount of the green phosphor on a mass basis.

4. The light-emitting device according to claim 1, wherein the sealing member further includes a sealing resin, and the sealing resin has a viscosity of 2,000 (mPa·s) or more and 7,000 (mPa·s) or less.

5. The light-emitting device according to claim 1, wherein a volume-based median diameter of the $Mn^{4+}$-activated fluoride complex phosphor is 10 μm or more and 90 μm or less.

6. The light-emitting device according to claim 1, wherein the sealing member further includes a red phosphor different from the $Mn^{4+}$-activated fluoride complex phosphor.

7. The light-emitting device according to claim 6, wherein the red phosphor different from the $Mn^{4+}$-activated fluoride complex phosphor is $CaAlSiN_3$:Eu or $(Sr.Ca)AlSiN_3$:Eu.

8. The light-emitting device according to claim 1, wherein the green phosphor is (Ba, Sr, Ca, Mg)$_2$SiO$_4$:Eu; (Mg, Ca, Sr, Ba)Si$_2$O$_2$N$_2$:Eu; (Ba, Sr)$_3$Si$_6$O$_{12}$N$_2$:Eu, Eu-activated β-SiAlON; (Sr, Ca, Ba)(Al, Ga, In)$_2$S$_4$:Eu; (Y, Tb)$_3$(Al, Ga)$_5$O$_{12}$:Ce; Ca$_3$(Sc, Mg, Na, Li)$_2$Si$_3$O$_{12}$:Ce; or (Ca, Sr)Sc$_2$O$_4$:Ce.

9. The light-emitting device according to claim 1, wherein the substrate includes an upper surface on which a recess is defined,
the recess includes a bottom surface on which the light-emitting element is located, and
the sealing member is in the recess.

10. The light-emitting device according to claim 9, wherein the recess includes an opening having a length of 1 mm or more and 5 mm or less in a longer side direction and a length of 0.05 mm or more and 0.8 mm or less in a shorter side direction.

11. A mounting board comprising:
the light-emitting device according to claim 1; and
a substrate on which the light-emitting device is mounted, wherein
the light-emitting device includes a light emission surface, and a surface that is perpendicular to the light emission surface and mounted on the substrate.

* * * * *